(12) United States Patent
Du

(10) Patent No.: US 10,700,643 B2
(45) Date of Patent: Jun. 30, 2020

(54) ENVELOPE-SHAPED BIAS FOR POWER AMPLIFIER

(71) Applicant: QUALCOMM Incorporated, San Diego, CA (US)

(72) Inventor: Chenliang Du, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,647

(22) Filed: Sep. 21, 2018

(65) Prior Publication Data

US 2019/0097584 A1   Mar. 28, 2019

Related U.S. Application Data

(60) Provisional application No. 62/562,215, filed on Sep. 22, 2017.

(51) Int. Cl.
| | |
|---|---|
| *H03F 1/02* | (2006.01) |
| *H03F 3/217* | (2006.01) |
| *H03F 3/193* | (2006.01) |
| *H03F 3/24* | (2006.01) |
| *H03F 3/191* | (2006.01) |

(52) U.S. Cl.
CPC .......... *H03F 1/0222* (2013.01); *H03F 3/191* (2013.01); *H03F 3/193* (2013.01); *H03F 3/2175* (2013.01); *H03F 3/245* (2013.01); *H03F 2200/102* (2013.01); *H03F 2200/411* (2013.01); *H03F 2200/451* (2013.01)

(58) Field of Classification Search
CPC .................................................... H03F 1/0222
USPC ........................................................ 330/127
See application file for complete search history.

(56) References Cited

U.S. PATENT DOCUMENTS

| | | | | |
|---|---|---|---|---|
| 7,616,053 | B2 * | 11/2009 | Kim ......................... | H03C 1/36 330/10 |
| 8,803,612 | B1 * | 8/2014 | Ooi ....................... | H03F 1/3205 330/288 |
| 2005/0270103 | A1 * | 12/2005 | Constantin ............ | H03F 1/0261 330/285 |
| 2008/0024214 | A1 * | 1/2008 | Kim ......................... | H03C 1/36 330/136 |
| 2011/0006846 | A1 | 1/2011 | Miho et al. | |
| 2011/0070848 | A1 * | 3/2011 | Ramachandra Reddy .................. | H03F 1/0227 455/127.2 |
| 2011/0298545 | A1 * | 12/2011 | Morimoto ............. | H03F 1/0216 330/296 |

(Continued)

*Primary Examiner* — Patricia T Nguyen
(74) *Attorney, Agent, or Firm* — Paradice and Li LLP/Qualcomm

(57) ABSTRACT

This disclosure provides systems, methods and apparatuses for characterizing and operating a power amplifier. Before being placed into operation, output phase and output gain characteristics of the power amplifier may be determined over various operating conditions including varying two independent control signals and a supply voltage. The output phase and output gain characteristics may be stored for later retrieval. The power amplifier may be operated by determining a control signal profile for the two independent control signals based on operating conditions and radio-frequency (RF) envelope information associated with an input signal received by the power amplifier. The independent control signals may be generated in accordance with the control signal profile.

27 Claims, 13 Drawing Sheets

(56) References Cited

U.S. PATENT DOCUMENTS

| | | | |
|---|---|---|---|
| 2012/0280752 A1* | 11/2012 | Jones | H03F 1/0227 |
| | | | 330/289 |
| 2015/0015339 A1* | 1/2015 | Gorbachov | H03F 1/0266 |
| | | | 330/291 |
| 2015/0070095 A1* | 3/2015 | Cabanillas | H03F 1/0222 |
| | | | 330/296 |
| 2015/0105033 A1* | 4/2015 | Modi | H03F 3/191 |
| | | | 455/78 |
| 2015/0130540 A1* | 5/2015 | Hasegawa | H03F 1/0266 |
| | | | 330/261 |
| 2017/0126183 A1* | 5/2017 | Honda | H03F 1/32 |
| 2017/0133989 A1* | 5/2017 | Dykstra | H03F 1/3205 |

\* cited by examiner

ENVELOPE-SHAPED BIAS FOR POWER AMPLIFIER

CROSS-REFERENCE TO RELATED APPLICATION

This application claims the benefit of and commonly owned U.S. Provisional Patent Application No. 62/562,215 entitled "ENVELOPE-SHAPED LINEARIZATION FOR RF POWER AMPLIFIER FOR VARYING NON-CONSTANT ENVELOPE SIGNAL" filed on Sep. 22, 2017, the entirety of which is hereby incorporated by reference.

TECHNICAL FIELD

The present implementations relate generally to wireless devices, and more specifically to linearizing output characteristics of a power amplifier (PA) included in a wireless device.

DESCRIPTION OF THE RELATED TECHNOLOGY

Wireless devices communicate with other wireless devices by transmitting and receiving communication signals that carry communication data. For example, some wireless devices may transmit and receive communication signals in accordance with a Global System for Mobile (GSM) protocol, a Long-Term Evolution (LTE) protocol, or a wireless local area network (WLAN) protocol such as described by one of many IEEE 802.11 standards.

Conventionally, a wireless device includes one or more power amplifiers to amplify and transmit the communication signals. Power amplifier accuracy may be characterized by output phase and output gain parameters. A power amplifier having a relatively fixed output phase and a relatively constant output gain is said to be more accurate (e.g., linear) than a power amplifier having a varying output phase and a varying output gain.

A power amplifier that inaccurately (e.g., non-linearly) amplifies communication signals may cause errors that increase the difficulty of receiving and/or decoding the transmitted communication signals. A large number of errors may lead to a high error rate, which in turn may cause lower transmit data rates and/or a reduced effective transmission range.

Thus, there is a need to the improve the accuracy (e.g., linearity) of power amplifiers, and thereby improve the performance of wireless devices that use power amplifiers to transmit communication signals.

SUMMARY

The systems, methods and devices of this disclosure each have several innovative aspects, no single one of which is solely responsible for the desirable attributes disclosed herein.

One innovative aspect of the subject matter described in this disclosure may be implemented as a method for operating a power amplifier. The method may include determining, by an amplifier controller, radio-frequency (RF) envelope information associated with an RF input signal received by the power amplifier, determining operating conditions associated with the power amplifier, determining output phase characteristics of the power amplifier based on the operating conditions, determining output gain characteristics of the power amplifier based on the operating conditions and the output phase characteristics, and generating a control signal profile for a first control signal and a second control signal for the power amplifier based on the output phase characteristics, the output gain characteristics and the RF envelope information.

Another innovative aspect of the subject matter described in this disclosure may be implemented as a power amplifier. In some implementations, the power amplifier may include a first amplifying stage, a second amplifying stage, a memory configured to store instructions that, when executed by one or more processors, cause the power amplifier to determine radio-frequency (RF) envelope information associated with an RF input signal received by the power amplifier, determine operating conditions associated with the power amplifier, determine output phase characteristics of the power amplifier based on the operating conditions, determine output gain characteristics of the power amplifier based on the operating conditions and the output phase characteristics, and generate a control signal profile for a first control signal and a second control signal for the power amplifier based on the output phase characteristics, the output gain characteristics and the RF envelope information.

Another innovative aspect of the subject matter described in this disclosure may be implemented as another implementation of a power amplifier. The power amplifier may include a means for determining radio-frequency (RF) envelop information associated with an RF input signal received by the power amplifier, a means for determining operating conditions associated with the power amplifier, a means for determining output phase characteristics of the power amplifier based on the operating conditions, a means for determining output gain characteristics of the power amplifier based on the operating conditions and the output phase characteristics, and a means for generating a control signal profile for a first control signal and a second control signal for the power amplifier based on the output phase characteristics, the output gain characteristics and the RF envelope information.

Another innovative aspect of the subject matter described in this disclosure may be implemented as a non-transitory computer-readable storage medium comprising instructions that, when executed by one or more processors of a wireless device, cause the wireless device to perform operations comprising determining radio-frequency (RF) envelope information associated with an RF input signal received by a power amplifier, determining operating conditions associated with the power amplifier, determining output phase characteristics of the power amplifier based on the operating conditions, determining output gain characteristics of the power amplifier based on the operating conditions and the output phase characteristics, and generating a control signal profile for a first control signal and a second control signal for the power amplifier based on the output phase characteristics, the output gain characteristics and the RF envelope information.

DETAILED DESCRIPTION

Figure 1:
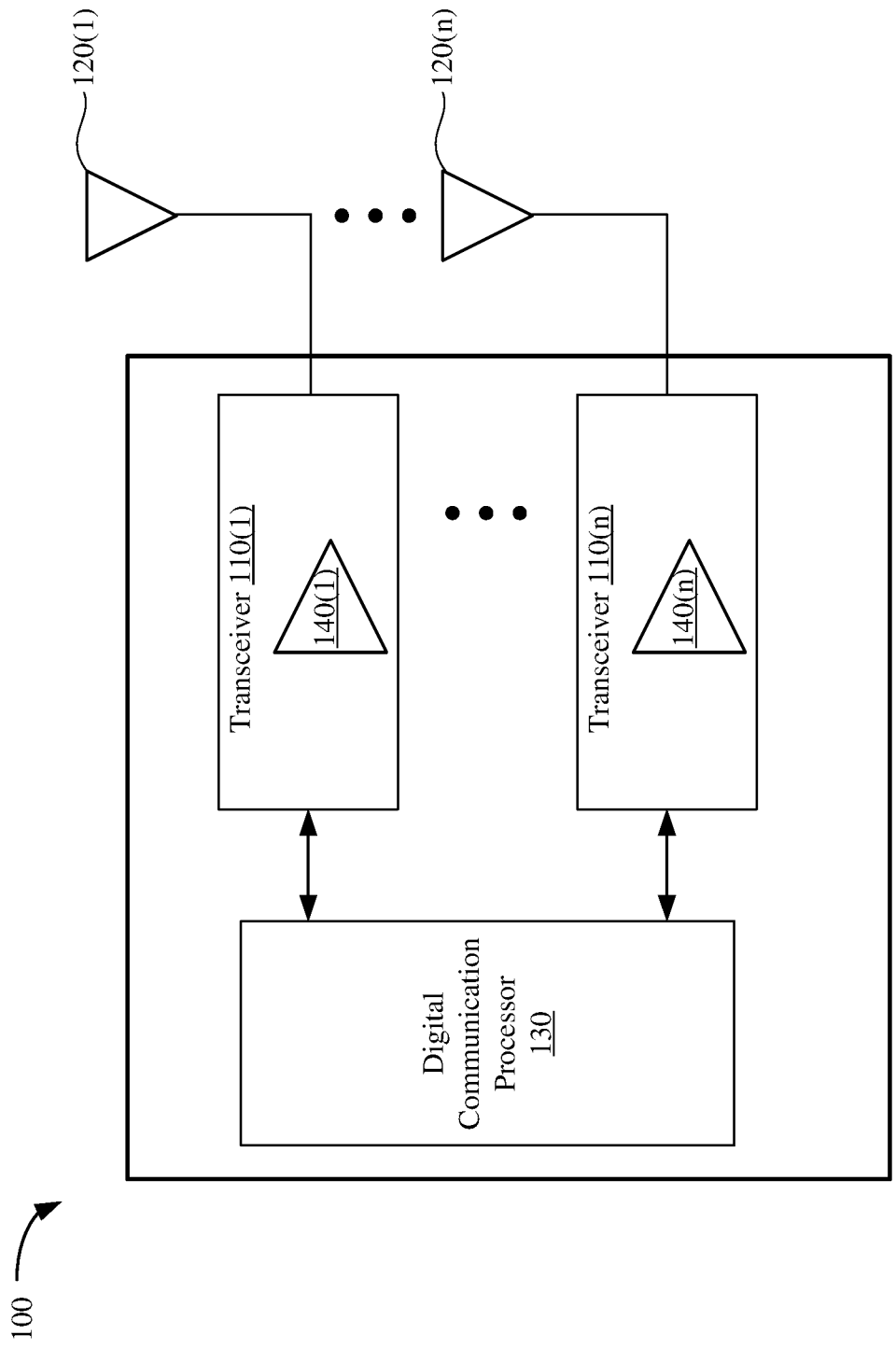
FIG. 1 depicts a block diagram of a wireless device.

Aspects of the present disclosure are described below in the context of linearizing performance of power amplifiers used to transmit wireless signals. It is to be understood that aspects of the present disclosure are equally applicable to controlling any suitable power amplifiers used to transmit any suitable communication signal.

In the following description, numerous specific details are set forth such as examples of specific components, circuits, and processes to provide a thorough understanding of the disclosure. The term "coupled" as used herein means coupled directly to or coupled through one or more intervening components or circuits. In addition, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "aggregating", "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any such list including multiples of the same members (e.g., any lists that include aa, bb, or cc).

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system or network that is capable of transmitting and receiving RF signals according to any of the IEEE 802.16 standards, or any of the IEEE 802.11 standards, the Bluetooth® standard, code division multiple access (CDMA), frequency division multiple access (FDMA), time division multiple access (TDMA), Global System for Mobile communications (GSM), GSM or General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HS-DPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

Particular implementations of the subject matter described in this disclosure can be implemented to realize one or more of the following potential advantages. The implementations may improve the performance of wireless devices configured to transmit various wireless signals at various output levels. For example, a wireless device may include a transceiver with a power amplifier controlled at least in part by two or more shaped (profiled) control signals. The power amplifier may be analyzed, before operation, to characterize output phase and output gain performance with respect to bias voltages, bias currents, a supply voltage ($V_{CC}$) of the power amplifier, and other control signals. The two or more shaped control signals may be generated to provide a controlled output phase and output gain of the power amplifier. In some implementations, the control signals may be bias voltages, bias currents, or a combination of both bias voltages and bias currents. The supply voltage ($V_{CC}$) and the control signals may be generated based on RF envelope information associated with an RF power amplifier input signal.

FIG. 1 depicts a block diagram of a wireless device 100 within which example embodiments may be implemented. The wireless device 100 may include one or more transceivers 110(1)-110(n) coupled to one or more antennas 120(1)-120(n), and a digital communication processor 130. The wireless device 100 may include any feasible number (n) of transceivers and/or antennas, although only two are shown here for simplicity. The wireless device 100 also may include other elements (such as oscillators, low noise amplifiers, phase-locked loops, clock synthesizers, antenna switching elements, and so on) which are not shown for simplicity.

The digital communication processor 130 may be coupled to the one or more transceivers 110(1)-110(n) and may provide communication data to, and receive communication data from, the one or more transceivers 110(1)-110(n). The digital communication processor 130 also may process the communication data in accordance with a wireless communication protocol (such as a cellular protocol, a WLAN protocol, a Bluetooth protocol, a Zig-Bee protocol, and the like).

In some aspects, the one or more transceivers 110(1)-110(n) may receive communication data from the digital communication processor 130, encode and modulate the communication data, and generate an analog output signal for transmission via one or more coupled antennas 120(1)-120(n). The antennas 120(1)-120(n) may be coupled directly or indirectly (such as through an antenna selection circuit, not shown for simplicity) to the transceivers 110(1)-110(n). The one or more transceivers 110(1)-110(n) also may receive communication signals transmitted from other wireless devices via the one or more antennas 120(1)-120(n), demodulate and decode the received communication signals, and provide the decoded received communication signals to the digital communication processor 130. While each of the transceivers 110(1)-110(n) is illustrated as being coupled to a respective antenna 120(1)-120(n), one or more of the transceivers 110(1)-110(n) may be permanently or selectively coupled to a plurality of antennas, and/or one or more of the antennas 120(1)-120(n) may be permanently or selectively coupled to a plurality of transceivers.

Each transceiver 110(1)-110(n) may include a linearizable power amplifier (PA) 140(1)-140(n) to receive, amplify and transmit one or more analog output signals. Although only one linearizable PA 140(1)-140(n) is illustrated within each transceiver 110(1)-110(n), each transceiver 110(1)-110(n) may include any feasible number of linearizable PAs. The operating characteristics (output phase and output gain) of each linearizable PA 140(1)-140(n) may be determined prior to operation (such as by bench testing or other techniques). For example, each linearizable PA 140(1)-140(n) may be characterized with respect to operating conditions, such as for example, operating frequency, operating bandwidth, and/or network information. In addition, the each linearizable PA 140(1)-140(n) may be characterized with respect to two or more independent control signals and/or with respect to a supply voltage provided to each linearizable PA 140(1)-140(n). In some aspects, the supply voltage may be generated based on the analog output signal received by each linearizable PA 140(1)-140(n). In some other aspects, the independent control signals may be a first and a second bias signals that may be provided to the linearizable PA 140(1)-140(n) to affect the associated output phase and output gain. The first and second bias signals may be bias voltages or bias currents. In some implementations, one of the bias signals may be a voltage while the other bias signal may be a current. Further, the first bias signal may be independent of the second bias signal. Example operations of a linearizable PA, such as linearizable PAs 140(1)-140(n), are described in more detail below with respect to FIGS. 2-8.

Figure 2:
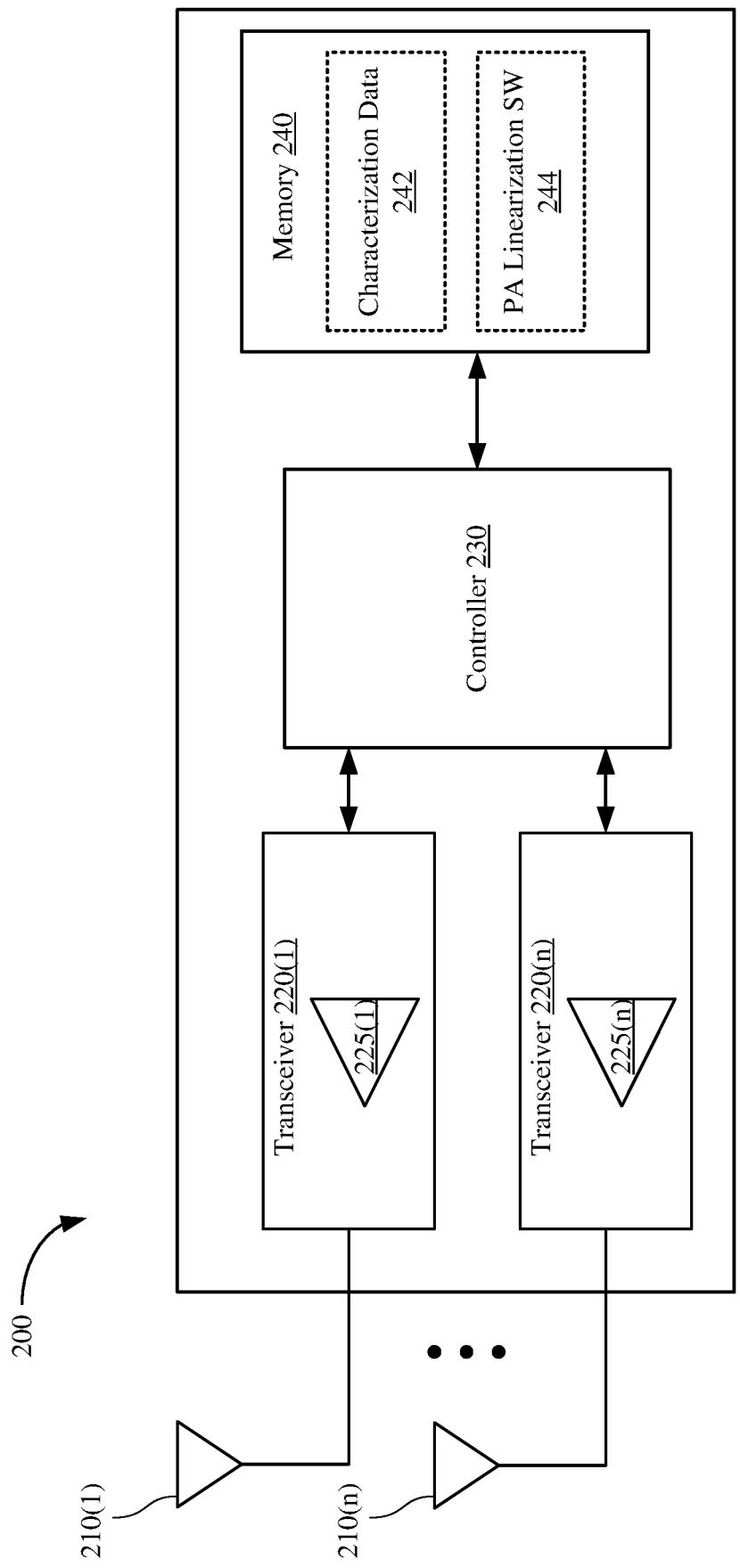
FIG. 2 is a block diagram of another example wireless device.

FIG. 2 is a block diagram of another example wireless device 200. The wireless device 200 may be an implementation of the wireless device 100 of FIG. 1. The wireless device 200 may include one or more antennas 210(1)-210(n), one or more transceivers 220(1)-220(n), a controller 230, and a memory 240. The antennas 210(1)-210(n) may be coupled directly or indirectly (such as through an antenna selection circuit, not shown for simplicity) to the transceivers 220(1)-220(n).

The transceivers 220(1)-220(n) may be implementations of the transceivers 110(1)-110(n) of FIG. 1. The transceivers 220(1)-220(n) may be used to transmit signals to, and receive signals from, other suitable wireless devices. Although not shown in FIG. 2 for simplicity, the transceivers 220(1)-220(n) may include any number of transmit chains and receive chains. Each transceiver 220(1)-220(n) may include a linearizable PA 225(1)-225(n) to process and transmit signals to other wireless devices via the antennas 210(1)-210(n).

The memory 240 may be coupled to the controller 230. The memory may include characterization data 242. For example, the characterization data 242 may include output phase and output gain characteristics for the linearizable PAs 225(1)-225(n) based at least in part on a first bias signal, a second bias signal, and a supply voltage ($V_{CC}$). In some example implementations, the first bias signal may be a first voltage or current supplied to a first amplifying stage of the PA and the second bias signal may be a second voltage or current supplied to a second amplifying stage of the PA. Output phase and output gain characteristics are described in more detail below in conjunction with FIGS. 4 and 7.

The memory 240 may include a non-transitory computer-readable storage medium (such as one or more nonvolatile memory elements, such as EPROM, EEPROM, Flash memory, a hard drive, etc.) that may store a PA linearization software (SW) module 244. Execution of the PA linearization SW module 244 may cause the controller 230 to determine operating conditions associated with the wireless device 200 and/or one or more linearizable PAs within one or more transceivers, determine associated supply voltages (e.g., $V_{CC}$) and, in response, may generate two or more independent control signals such as the first bias signal and the second bias signal. In some implementations, the PA linearization SW module 244 may be executed as a user application program and may include instructions that when executed cause the controller 230 to perform some or all of the operations described with respect to FIGS. 6 and 8.

The controller 230, which may be coupled to the transceivers 220(1)-220(n) and the memory 240, may be any one or more suitable controllers or processors capable of executing scripts or instructions of one or more software programs stored in the wireless device 200 (e.g., within the memory 240). In some example implementations, the controller 230 may be implemented with a hardware controller, a processor, a state machine and/or other circuits to provide the functionality of executing instructions stored in the memory 240. In other example implementations, the controller 230 may be referred to as a universal or central controller that may control not only the transceivers 220(1)-220(n), but also other aspects of the wireless device 200 such as a display and/or user input (e.g., a keypad, a touch pad, or the like) devices. In still another example implementation, the controller 230 may be fully or partially distributed within the transceivers 220(1)-220(n).

Figure 3A:
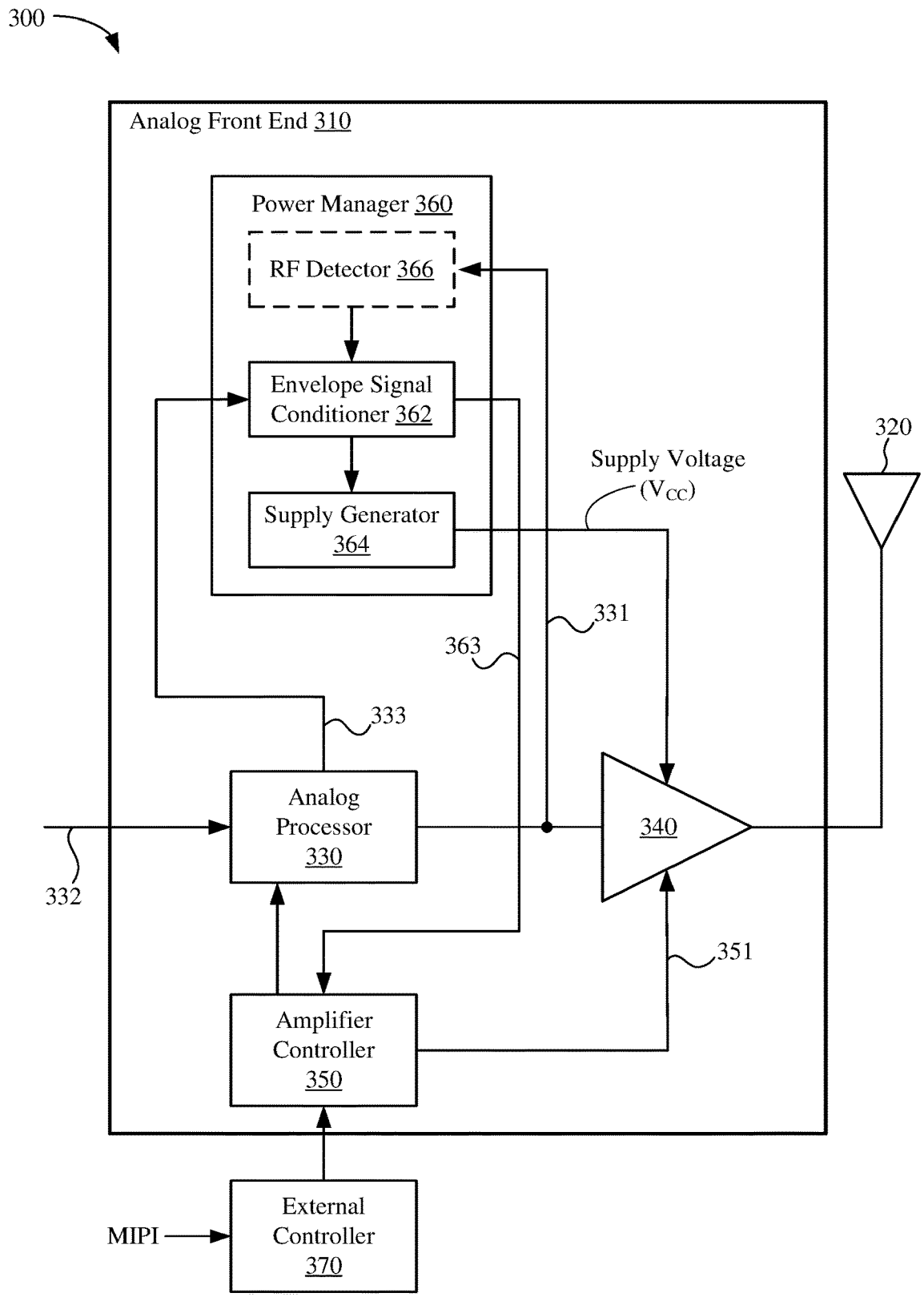
FIG. 3A depicts a block diagram of a transceiver.

FIG. 3A depicts a block diagram of a transceiver 300. The transceiver 300 may be an embodiment of at least a portion of one or more of the transceivers 110(1)-110(n) of FIG. 1 or of the transceivers 220(1)-220(n) of FIG. 2. The transceiver 300 may include an analog front end 310 coupled to an antenna 320. The analog front end 310 may include an analog processor 330, a linearizable PA 340, an amplifier controller 350, and a power manager 360. The linearizable PA 340 may be an embodiment of one or more of the linearizable PAs 140(1)-140(n) of FIG. 1 or one or more of the linearizable PAs 225(1)-225(n) of FIG. 2. In some implementations, the linearizable PA 340 may be a multi-stage PA including at least a first amplifying stage and a second amplifying stage.

The analog processor 330 may receive communication data 332 (such as data from the digital communication processor 130 of FIG. 1). The analog processor 330 may include one or more digital-to-analog converters (DACs), mixers, oscillators, filters, and so on (not shown for simplicity) to generate an analog output signal 331 for amplification and transmission through a wireless medium. The linearizable PA 340 may receive and amplify the analog output signal 331 in accordance with at least a supply voltage ($V_{CC}$) and two or more bias signals 351. In some example implementations, the analog output signal 331 also may be referred to as an RF input signal for the linearizable PA 340.

The power manager 360 may be coupled to the analog processor 330 and the linearizable PA 340. The power manager 360 may include an envelope signal conditioner 362 and a supply generator 364. In some example implementations, the envelope signal conditioner 362 may receive RF envelope information 333 (e.g., RF envelope data) associated with the analog output signal 331. As shown, the RF envelope information 333 may be provided to the envelope signal conditioner 362 by the analog processor 330 or any other feasible circuit or module, for example envelope tracking (ET) circuitry. The envelope signal conditioner 362 may scale (e.g., increase or decrease a magnitude), offset (e.g., positively or negatively shift data with respect to a reference voltage or current), and/or delay (e.g., time shift) the RF envelope information 333.

The envelope signal conditioner 362 may be coupled to the supply generator 364. The supply generator 364 may generate the supply voltage ($V_{CC}$) based on data and/or signals from the envelope signal conditioner 362. In some implementations, the envelope signal conditioner 362 may provide information corresponding to a magnitude of the analog output signal 331 (discussed below with respect to RF detector 366) and/or the RF envelope information 333 to the supply generator 364. The envelope signal conditioner 362 also may provide processed RF envelope information 363 to the amplifier controller 350. The supply generator 364 may generate a supply voltage ($V_{CC}$) for the linearizable PA 340. The supply voltage ($V_{CC}$) may be generated in accordance with the magnitude of the analog output signal 331 as determined by the envelope signal conditioner 362.

The power manager 360 may optionally include an RF detector 366. The RF detector 366 may detect the presence and/or magnitude of the analog output signal 331. In some implementations, the RF detector 366 also may determine an average power or a power envelope associated with the analog output signal 331 to determine a signal magnitude associated with the analog output signal 331. The RF detector 366 may provide RF envelope information to the envelope signal conditioner 362.

The amplifier controller 350 may be coupled to the analog processor 330, the power manager 360, and the linearizable PA 340. The amplifier controller 350 may control (e.g., linearize) the output of the linearizable PA 340 by providing the two or more bias signals 351 in accordance with a profile based at least in part on an a priori characterization of the linearizable PA 340. In some embodiments, the two or more bias signals 351 may be a driver amplifier (DA) bias voltage or current supplied to a first amplifying stage of the linearizable PA 340 and a PA bias voltage or current supplied to a second amplifying stage of the linearizable PA 340. Thus, the amplifier controller 350 may provide the DA bias voltage/current and the PA bias voltage/current in accordance with a bias profile based on the characterization of the linearizable PA 340. Additionally, or alternatively, the amplifier controller 350 may generate the two or more bias signals 351 based at least in part on the supply voltage ($V_{CC}$) supplied by the supply generator 364. The amplifier controller 350 may include a processor, state machine, and so on (not shown for simplicity) to control the generation of the two independent control signals. The amplifier controller 350 may directly or indirectly determine one or more operating conditions associated with the transceiver 300, the linearizable PA 340, and/or the wireless device 200 (not shown for simplicity). For example, the amplifier controller 350 may determine the independent control signals based on network information received from external controller 370. Network information may include transmit channels, transmit frequencies, transmit bandwidth, resource blocks, and time duration, spectrum mask (e.g., depending both on network protocols and/or geographic-specific regulation). In some implementations, the external controller 370 may comprise the controller 230 of FIG. 2. Thus, the amplifier controller 350 may individually, or combined with the external controller 370, perform any or all of the tasks described above. In one implementation, the amplifier controller 350 may directly or indirectly receive operating condition information through a Mobile Industry Processor Interface (MIPI) bus. In some embodiments, the amplifier controller 350 may perform the tasks above based on information stored (e.g., in the memory 240) in the external controller 370. In some embodiments, the external controller 370 may also be configured to provide network information to and/or control other components of the analog front end 310, for example one or more filters, switches, antenna tuners, and/or low noise amplifiers (not illustrated). Further, the external controller 370 may comprise a microcontroller and in some embodiments is implemented as a component in the analog front end 310 instead of being external to the front end. Characterization of the linearizable PA 340 is described in more detail below in conjunction with FIGS. 4-5. Operation of the transceiver 300 is described in more detail below in conjunction with FIGS. 6-8.

Figure 3B:
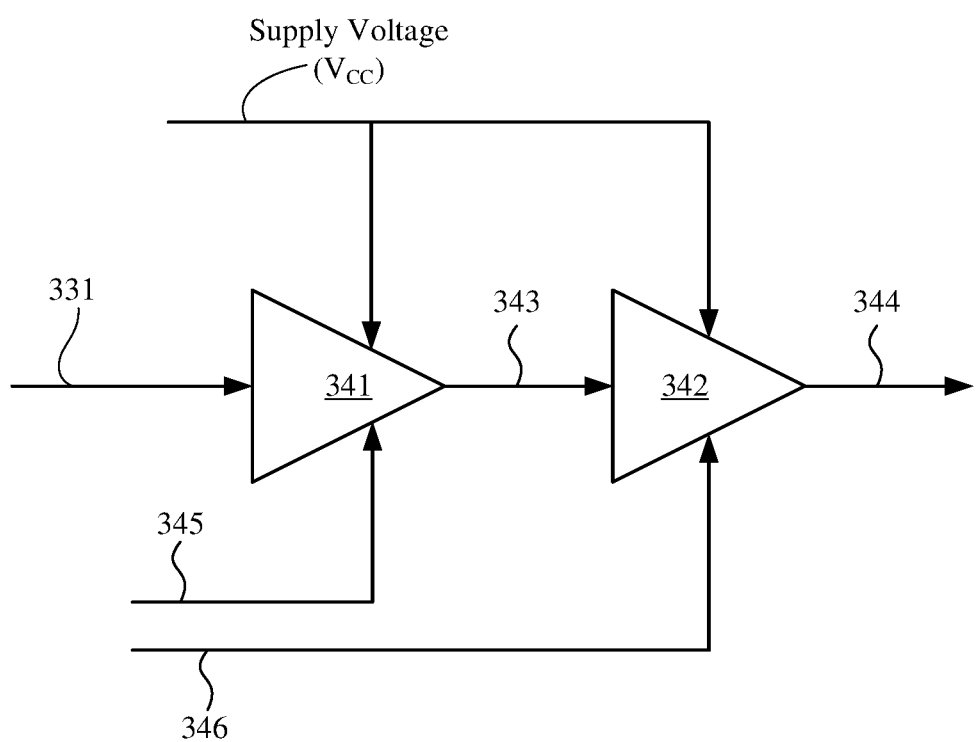
FIG. 3B depicts a partial block diagram of the power amplifier of FIG. 3A.

FIG. 3B depicts a partial example block diagram of the linearizable PA 340 of FIG. 3A. The linearizable PA 340 may include a first amplifying stage 341 and a second amplifying stage 342. Both the first amplifying stage 341 and the second amplifying stage 342 may receive the supply voltage ($V_{CC}$) provided by the supply generator 364 of FIG. 3A. The first amplifying stage 341 may receive and amplify the analog output signal 331 and generate an intermediate signal 343. The second amplifying stage 342 may receive and amplify the intermediate signal 343 and generate an RF output signal 344 that may be coupled to the antenna 320 of FIG. 3A.

The first amplifying stage 341 may receive a first bias signal 345 and the second amplifying stage 342 may receive a second bias signal 346 (e.g., a second control signal). The first bias signal 345 and the second bias signal 346 may be examples of the bias signals 351 and may be generated by the amplifier controller 350 to linearize the linearizable PA 340. The first bias signal 345 and the second bias signal 346 may be determined based on the a priori characterization of the linearizable PA 340. Determination of the profile of the first bias signal 345 and the second bias signal 346 is described in more detail below in conjunction with FIGS. 4-8. The first bias signal 345 and the second bias signal 346 may be voltage signals, current signals or a combination thereof.

Figure 3C:
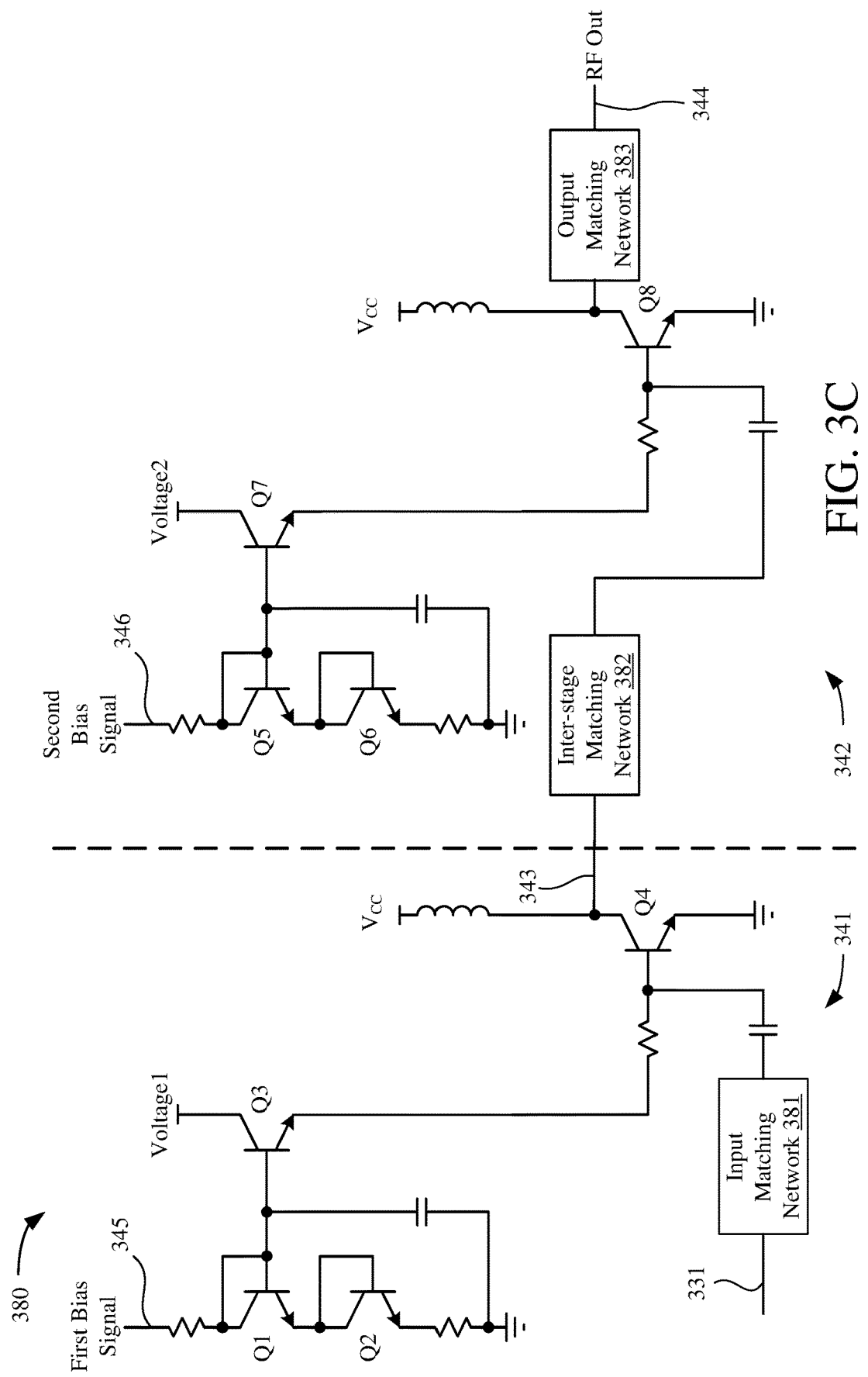
FIG. 3C is a simplified schematic of an example implementation of the power amplifier of FIG. 3B.

FIG. 3C is a simplified schematic 380 of an example implementation of the power amplifier of FIG. 3B. In particular, the schematic 380 depicts example circuitry associated with the first amplifying stage 341 to the left of the dashed line and circuitry associated with the second amplifying stage 342 to the right of the dashed line. In other implementations, more or fewer components may be included with each of the first amplifying stage 341 and the second amplifying stage 342. Persons having skill in the art will recognize that the first amplifying stage 341 and the second amplifying stage 342 may be implemented in a plurality of ways. Therefore, the schematic 380 is meant to be illustrative rather than limiting.

The first amplifying stage 341 may include transistors Q1-Q4 and an input matching network 381. Those skilled in the art will appreciate that the first amplifying stage 341 may include other components (e.g., inductors, resistors, capacitors) not described here for simplicity. Although depicted as NPN transistors, the transistors Q1-Q4 may be PNP transistors, NMOS FETS, PMOS FETS, BJTS or any other feasible component or components. The first amplifying stage 341 may receive a first voltage (e.g., Voltage1). The first voltage Voltage1 may be a bias voltage provided to the transistor Q3. In some implementations, the first voltage Voltage1 may be a dynamic voltage based on the RF envelope information 333, however the first voltage Voltage1 may be generated independently of the first bias signal 345. The first voltage Voltage1 may be coupled to any feasible component within the first amplifying stage 341, shown here coupled to the transistor Q3, as an example.

The analog output signal 331 may be received and processed by the input matching network 381 and coupled to the transistor Q4. The input matching network 381 may include one or more components to match an impedance, for example, of the analog output signal 331 to the first amplifying stage 341. Notably, implementations of the input matching network 381 may vary for different wireless device 200 designs. Each implementation of the input matching network 381 may have a different effect on a gain and/or phase of the first amplifying stage 341. The first bias signal 345 may be coupled to a collector of the transistor Q1. The first bias signal 345 may be a voltage or a current. The transistors Q1 and Q3 may form a current mirror and enable the first bias signal 345 to affect a base current of the transistor Q4. Altering the base current of the transistor Q4 may change, at least in part, gain and/or phase characteristics of the first amplifying stage 341, and therefore the linearizable PA 340. Notably, the current mirror formed by the transistors Q1 and Q3 may be well suited to buffering bias currents. Other devices and/or circuits may be used to buffer bias voltages (devices and circuits not shown for simplicity). Selection of a bias current or a bias voltage for the first bias signal 345 may be based on the devices used to implement the first amplifying stage 341. For example, bias currents may be more well suited for a first amplifying stage 341 including BJTs or heterojunction bipolar transistors (HBTs). On the other hand, bias voltages may be more well suited for a first amplifying stage 341 including FETs or high-electron mobility transistors (HEMTs). The first amplifying stage 341 may generate the intermediate signal 343 that is coupled to the second amplifying stage 342.

The second amplifying stage 342 may include transistors Q5-Q8 and an inter-stage matching network 382. Those skilled in the art will appreciate that the second amplifying stage 342 may include other components (e.g., inductors, resistors, capacitors) not described here for simplicity. Although depicted as NPN transistors, the transistors Q5-Q8 may be PNP transistors, NMOS FETS, PMOS FETS, BJTS or any other feasible component or components. The second amplifying stage 342 may receive a second voltage (e.g., Voltage2). The second voltage Voltage2 may be a bias voltage provided to the transistor Q7. In some implementations, the second voltage Voltage2 may be a dynamic voltage based on the RF envelope information 333, however the second voltage Voltage2 may be generated independently of the second bias signal 346. The second voltage Voltage2 may be coupled to any feasible component within the second amplifying stage 342, shown here coupled to the transistor Q7, as an example.

The intermediate signal 343 may be received and processed by the inter-stage matching network 382 and coupled to the transistor Q8. The inter-stage matching network 382 may include one or more components to match an impedance, for example, of the intermediate signal 343 to the second amplifying stage 342. Similar to the input matching network 381 of the first amplifying stage 341, implementations of the inter-stage matching network 382 may vary for different wireless device 200 designs. Each implementation of the inter-stage matching network 382 may have a different effect on a gain and/or phase response of the second amplifying stage 342. The second bias signal 346 may be coupled to a collector of the transistor Q5. The second bias signal 346 may be a voltage or a current. The transistors Q5 and Q7 may form a current mirror and enable the second bias signal 346 to affect a base current of the transistor Q8. Altering the base current of the transistor Q8 may change, at least in part, gain and/or phase characteristics of the second amplifying stage 342, and therefore the linearizable PA 340. Similar to as described above with respect to the first bias signal 345, the second bias signal 346 may be implemented as a bias voltage or a bias current based on the circuits and/or devices associated with the second amplifying stage 342. The second amplifying stage 342 may generate the RF output signal 344 that is coupled to the antenna 320 through an output matching network 383. Each implementation of the output matching network 383 may have a different effect on a gain and/or phase of the second amplifying stage 342.

As described above with respect to FIG. 3A, the amplifier controller 350 may generate the first bias signal 345 and the second bias signal 346. In some embodiments, the amplifier controller 350 may generate three or more independent control signals. One implementation of a bias signal generator is described below in conjunction with FIGS. 3D-3F.

Figure 3D:
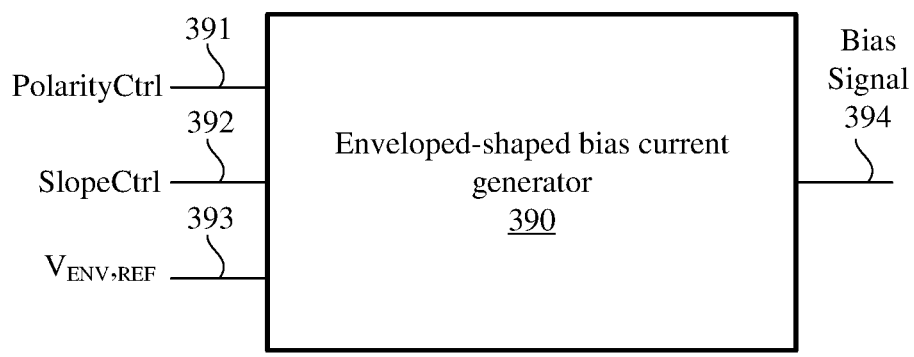
FIG. 3D is a block diagram of an implementation of an envelope-shaped bias signal generator.

FIG. 3D is a block diagram of an implementation of an envelope-shaped bias signal generator 390. In some implementations, the amplifier controller 350 may include a plurality of envelope-shaped bias signal generators 390 to generate a plurality of bias signals. Thus, a first envelope-shaped bias signal generator 390 may generate the first bias signal 345 and a second envelope-shaped bias signal generator 390 may generate the second bias signal 346. In some other implementations, a single envelope-shaped bias signal generator 390 may generate both the first bias signal 345 and the second bias signal 346.

The envelope-shaped bias signal generator 390 may receive a PolarityCtrl signal 391, a SlopeCtrl signal 392, and envelope signals (e.g., $V_{ENV}$ and $V_{REF}$) 393 and may generate a bias signal 394. Note that in some embodiments, $V_{ENV}$ may be a signal responsive to the RF envelope information 333 while $V_{REF}$ may be a reference signal. In some implementations, the PolarityCtrl signal 391 and the SlopeCtrl signal 392 may be provided by the amplifier controller 350, the external controller 370, the controller 230 of FIG. 2, a combination thereof, or any other feasible device. The envelope signals 393 may be provided by the envelope signal conditioner 362 or any other feasible device. The bias signal 394 may be a current signal or a voltage signal.

As described above with respect to FIG. 3B, the output of the linearizable PA 340 may be linearized by the first bias signal 345 and the second bias signal 346. In some implementations, the linearization of the linearizable PA 340 may be based, at least in part, on the RF envelope information 333. For example, gain or phase characteristics of the linearizable PA 340 may vary based on the RF envelope of the RF input signal. Therefore, the linearizable PA 340 may be linearized by controlling a signal profile of the first bias signal 345 and the second bias signal 346 based on the RF envelope information 333.

The envelope-shaped bias signal generator 390 may generate one or more bias signals based, at least in part, on RF envelope information 333. Additional aspects of the bias signal (e.g., polarity and slope) may be determined by analysis of gain and phase characteristics of the linearizable PA 340. Determination of the first bias signal 345 and the second bias signal 346, including a determination of polarity and slope aspects of the bias signals, are described in more detail below in conjunction with FIGS. 4-8.

The PolarityCtrl signal 391 may control a polarity of the generated bias signal 394. In a similar manner, the SlopeCtrl signal 392 may control a slope associated with the generated bias signal 394. The envelope signal 393 may include an envelope reference signal and an envelope signal from the envelope signal conditioner 362. The envelope-shaped bias signal generator 390 may include a current-steering portion and a current digital-to-analog (DAC) portion.

The PolarityCtrl signal 391, the SlopeCtrl signal 392, and the envelope signal 393, together or separately, may determine a signal profile of the bias signal 394. Thus, in some implementations, the PolarityCtrl signal 391, the SlopeCtrl signal 392, and the envelope signal 393 may control a magnitude, an offset, and/or a slope of a generated bias signal 394. The PolarityCtrl signal 391 and the SlopeCtrl signal 392 may be provided to the envelope-shaped bias signal generator 390 to linearize the output of the linearizable PA 340.

Thus, in some implementations, a first envelope-shaped bias signal generator 390 may provide a first bias signal 345 for a first amplifying stage 341 and a second envelope-shaped bias signal generator 390 may provide a second bias signal 346 for a second amplifying stage 342. The PolarityCtrl signal 391 and the SlopeCtrl signal 392 for the first envelope-shaped bias signal generator 390 may be different from the PolarityCtrl signal 391 and the SlopeCtrl signal 392 for the second envelope-shaped bias signal generator 390. Therefore, the bias signal 394 from the first envelope-shaped bias signal generator 390 may be independent from the bias signal 394 from the second envelope-shaped bias signal generator 390.

Figure 3E:
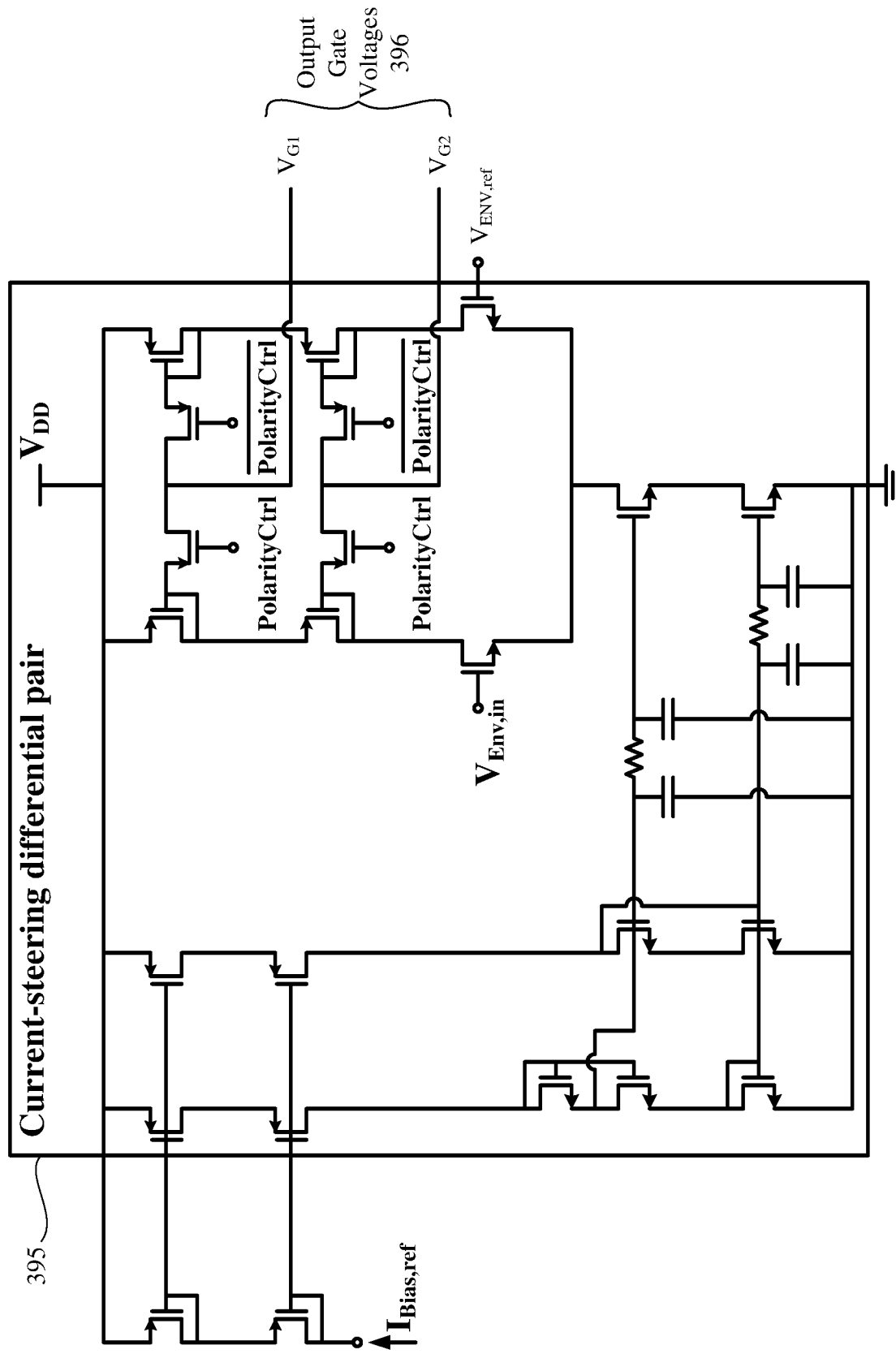
FIG. 3E shows a simplified schematic diagram of a current-steering portion of the envelope-shaped bias signal generator of FIG. 3D.

FIG. 3E shows a simplified schematic diagram of a current-steering portion 395 of the envelope-shaped bias signal generator 390 of FIG. 3D. The current-steering portion 395 may receive a bias current (shown as $I_{BIAS,REF}$), a voltage $V_{DD}$, the PolarityCtrl signal 391 (shown as PolarityCtrl and $\overline{PolarityCtrl}$), envelope signals 393 (shown as $V_{ENV,IN}$ and $V_{ENV,REF}$), and may generate output gate voltages 396 (shown as $V_{G1}$ and $VG_2$) for the current DAC portion of the envelope-shaped bias signal generator 390. The current-steering portion 395 may include a plurality of transistors, resistors, and capacitors. Persons skilled in the art will recognize that other implementations of the current-steering portion 395 are feasible and may include additional or fewer components than those illustrated in FIG. 3E to provide the output gate voltages 396.

Figure 3F:
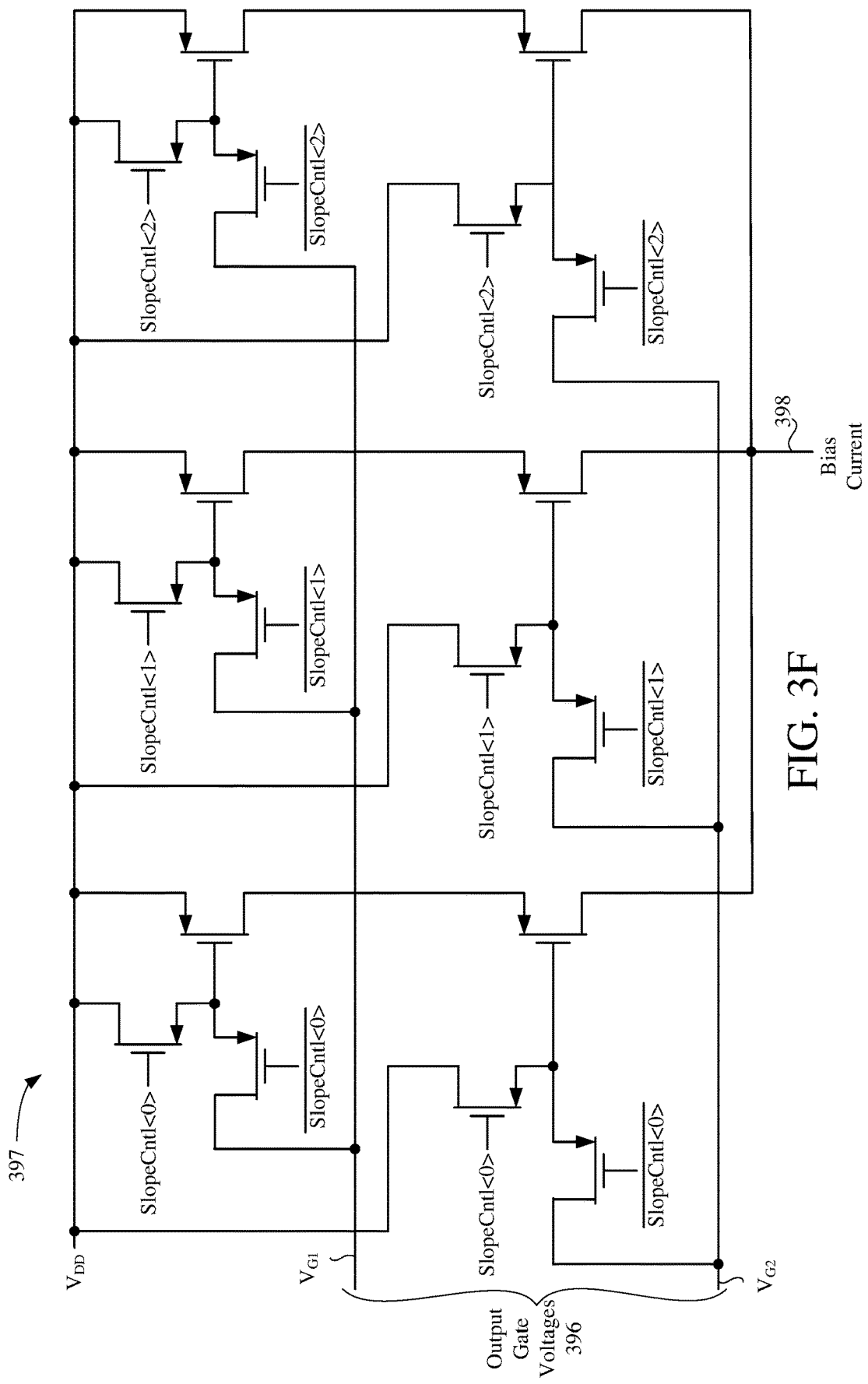
FIG. 3F shows a simplified schematic diagram of a current digital-to-analog converter portion of the envelope-shaped bias signal generator of FIG. 3D.

FIG. 3F shows a simplified schematic diagram of a current DAC portion 397 of the envelope-shaped bias signal generator 390 of FIG. 3D. The current DAC portion 397 may receive the output gate voltages 396 from the current-steering portion 395 and the SlopeCtrl signal 392 and may generate a bias signal 398. In some implementations, the SlopeCtrl signal 392 may be a multi-bit signal and each bit also may be available as a positive and a negative (e.g., differential) signal pair. For example, the SlopeCtrl signal 392 may include SlopeCtrl<0>, $\overline{SlopeCtrl<0>}$, SlopeCtrl<1>, $\overline{SlopeCtrl<1>}$, SlopeCtrl<2>, and $\overline{SlopeCtrl<2>}$ signals. The bias signal 398 may be a current sum of individual currents determined by the SlopeCtrl signal 392. Although in the example of FIG. 3F the bias signal 398 is a current, in other implementations, the bias signal 398 may be a voltage and may be generated by a different arrangement of components within the current-steering portion 395 and/or the current DAC portion 397.

Figure 4:
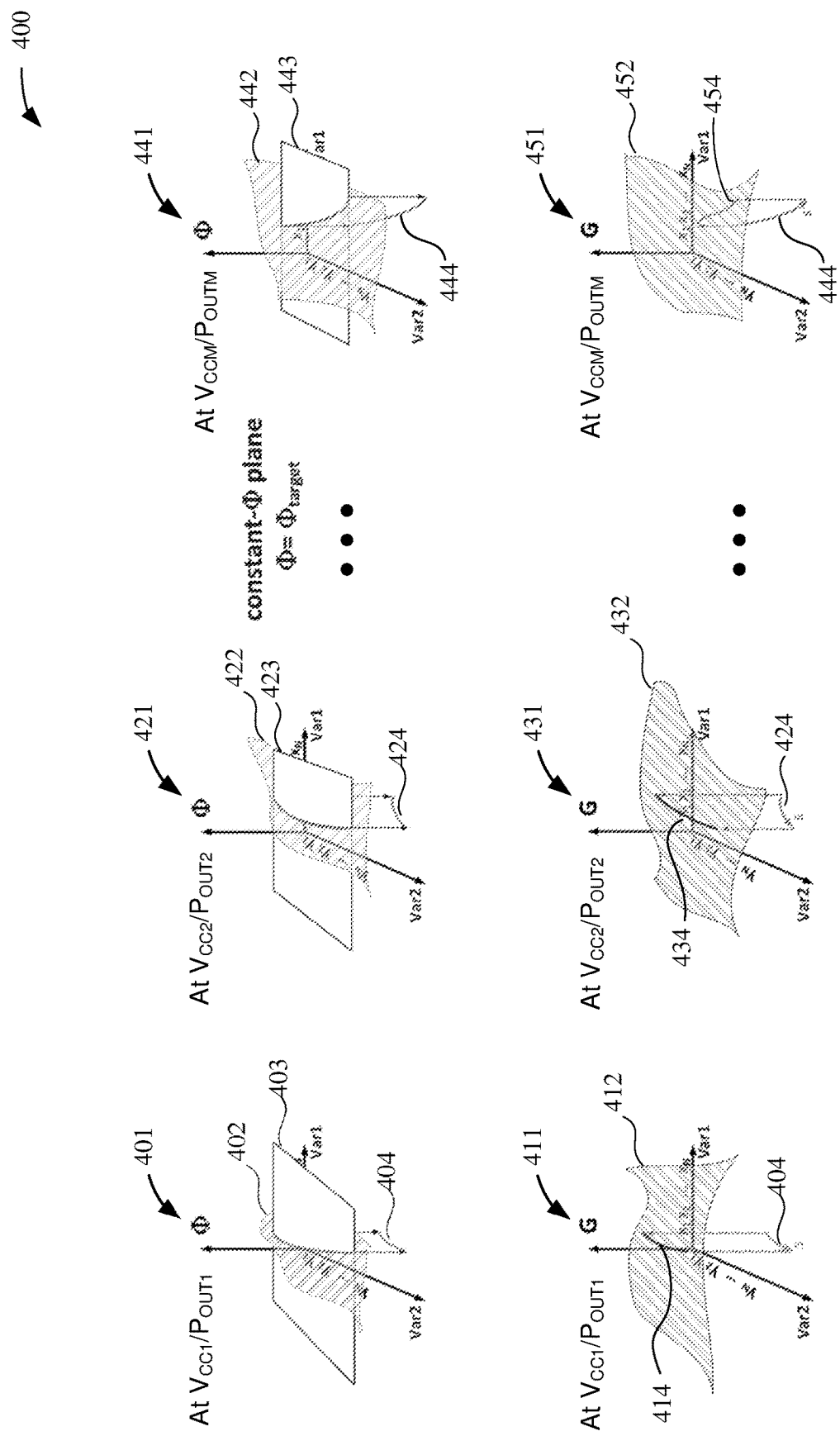
FIG. 4 depicts example graphs of output phase and output gain characteristics of the linearizable power amplifier of FIGS. 3A and 3B.

FIG. 4 depicts example graphs 400 of output phase and output gain characteristics of the linearizable PA 340 of FIGS. 3A and 3B. As described above, the output phase and output gain characteristics may be determined with respect to two independent control signals and different supply voltages ($V_{CC}$). In some example implementations, more than two independent control signals may be used. Further, in some implementations, the output phase and output gain characteristics may be determined m times, as illustrated here with m graphs. In some aspects, the independent control signals may be the first bias signal 345 and the second bias signal 346 described above with respect to FIGS. 3B-3D. In some other aspects, the independent control signals may be the PA bias voltage and the DA bias voltage. In the example of FIG. 4, the independent control signals described herein are the PA bias voltage and the DA bias voltage. Persons having ordinary skill in the art will recognize that other independent control signals are possible. For example, bias currents instead of bias voltages may be used to control the linearizable PA 340.

Phase plot 401 depicts a first phase characteristic 402 as a function of a first control signal (e.g., PA bias voltage, illustrated as var1) and a second control signal (e.g., DA bias voltage, illustrated as var2). The first phase characteristic 402 is plotted with respect to a three-dimensional axis formed by PA bias voltage, DA bias voltage, and Phase. As shown, the first phase characteristic 402 may be a surface (illustrated with diagonal lines) with respect to a first supply voltage ($V_{CC1}$). Note that the supply voltage may be generated based on RF envelope information as described above with respect to FIG. 3A. Thus, the first phase characteristic 402 may describe the output phase of the linearizable PA 340 with respect to the PA bias voltage, the DA bias voltage and the first supply voltage ($V_{CC1}$) (e.g., a first RF envelope size).

Gain plot 411 depicts a first gain characteristic 412 as a function of the PA bias voltage and the DA bias voltage. Similar to the first phase characteristic 402, the first gain characteristic 412 also may be shown as a surface (again illustrated with diagonal lines). The first gain characteristic 412 may describe the output gain of the linearizable PA 340 with respect to the PA bias voltage, the DA bias voltage, and the first supply voltage ($V_{CC1}$).

Phase plot 421 and phase plot 441 depict a second phase characteristic 422 and an m-th phase characteristic 442, respectively. The second phase characteristic 422 and the m-th phase characteristic 442 are shown as a function of the PA bias voltage and the DA bias voltage. The second phase characteristic 422 describes the output phase of the linearizable PA 340 with respect to a second supply voltage ($V_{CC2}$) (e.g., a second RF envelope size), and the m-th phase characteristic 442 describes the output phase of the linearizable PA 340 with respect to an m-th supply voltage ($V_{CCM}$) (e.g., an m-th RF envelope size).

Gain plot 431 and gain plot 451 depict a second gain characteristic 432 and an m-th gain characteristic 452, respectively, as a function of the PA bias voltage and the DA bias voltage. The second gain characteristic 432 is associated with the second supply voltage ($V_{CC2}$) (e.g., the second RF envelope size) and the m-th gain characteristic 452 is associated with the m-th supply voltage ($V_{CCM}$) (e.g., the m-th RF envelope size). Persons having ordinary skill in the art will appreciate that any number of phase plots and gain plots may be determined based at least in part on a voltage step size between the first supply voltage ($V_{CC1}$), the second supply voltage ($V_{CC2}$), and the m-th supply voltage ($V_{CCM}$).

The output phase and output gain characteristics shown in graph 400 may be determined by extensive bench testing of a variety of linearizable PAs 340. In some aspects, the bench testing may include testing linearizable PAs 340 fabricated at possible process corners and operating at environmental (e.g., voltage and temperature) corners. In some other aspects, the output phase and output gain characteristics may be determined through simulation.

Figure 5:
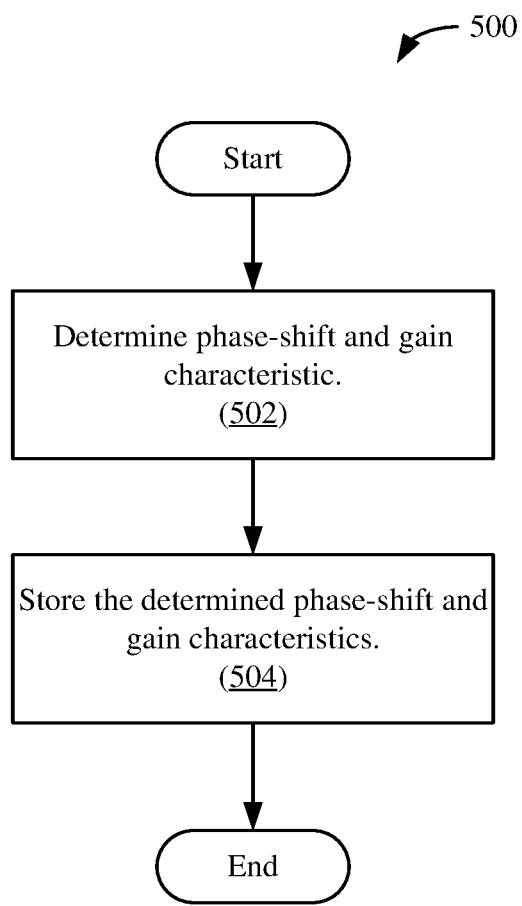
FIG. 5 is an illustrative flow chart depicting an example operation for determining output phase and output phase characteristics of a linearizable power amplifier of FIGS. 3A and 3B.

FIG. 5 is an illustrative flow chart depicting an example operation 500 for determining output phase and output phase characteristics of the linearizable PA 340 of FIG. 3A. The operation begins as output phase and output gain characteristic data associated with a linearizable PA 340 are determined (502). The output phase and output gain data may be determined through bench testing, extensive circuit simulation, or any other suitable method. Additionally, or alternatively, output phase and output gain characteristic data may be determined with respect to independent control signals such as a first control signal (e.g., a DA bias voltage) and a second control signal (e.g., a PA bias voltage) as described above with respect to FIG. 4. The output phase characteristics and output gain characteristics may be determined with respect to a number of different supply voltages ($V_{CC}$) determined by different RF envelopes.

Next, the determined output phase and output gain characteristics are stored in a memory (504) and the operation ends. In some aspects, the output phase and output gain characteristics may be stored in a memory or lookup table coupled to, or included within, the amplifier controller 350.

The example graphs 400 of FIG. 4 may be used to illustrate at least one implementation for determining profiles of the first control signal and the second control signal to linearize, at least in part, the linearizable PA 340. The first control signal may be a DA bias voltage and the second control signal may be a PA bias voltage. In other implementations, the control signals may be bias currents or a combination of bias voltages and bias currents. The procedure may include selecting a constant phase (sometimes referred to as an iso-phase) within a phase characteristic. Returning to the phase plot 401 of FIG. 4, a selected iso-phase 403 is depicted as a plane within the first phase characteristic 402 with respect to the first supply voltage ($V_{CC1}$) (e.g., a first RF envelope). Next, bias voltages (such as the PA bias voltage and the DA bias voltage) associated with the iso-phase 403 may be determined. Graphically, the intersection between the first phase characteristic 402 and the iso-phase 403 depicts the region in which a constant phase may be realized. Projecting this intersection to the PA bias voltage axis and the DA bias voltage axis (e.g., the Var1 and Var2 axis) determines a first PA bias voltage/DA bias voltage profile 404 (also referred to as a first bias voltage profile or as an iso-phase profile). Thus, the first bias profile describes a signal profile of a first bias signal and a second bias signal with respect to a supply voltage determined by a first RF envelope.

Next, the first bias voltage profile 404 is projected onto the first gain characteristic 412. An output gain 414 associated with the first bias voltage profile 404 may be determined from the projection (as illustrated with a curve on the first gain characteristic 412). Thus, for the iso-phase 403, the associated output gain 414 may be determined as a function of the first bias voltage profile 404.

Although only a single iso-phase 403 is illustrated in the phase plot 401 for simplicity, persons having ordinary skill in the art will recognize that any number of feasible iso-phases may be selected with respect to the first phase characteristic 402 when operating the linearizable PA 340 at the first supply voltage ($V_{CC1}$). Correspondingly, any number of bias voltage profiles associated with the number of iso-phases also may be determined.

Additionally, or alternatively, an iso-phase 423 may be selected within the second phase characteristic 422. The iso-phase 423 may represent the same output phase represented by the iso-phase 403. Notably, the second phase characteristic 422 and the second gain characteristic 432 are with respect to a different supply voltage ($V_{CC2}$) (e.g., a second RF envelope) compared to the first phase characteristic 402 and the first gain characteristic 412. The PA bias voltages and the DA bias voltages associated with the iso-phase 423 (which are depicted in a second bias voltage profile 424) may be determined. The second bias voltage profile 424 may be projected onto the second gain characteristic 432, and an output gain 434 associated with the second bias voltage 424 may be determined from the projection. Thus, the second bias profile may describe a signal profile of the first bias signal and the second bias signal with respect to a supply voltage determined by a second RF envelope.

An iso-phase 443 may be selected with the m-th phase characteristic 442. The iso-phase 443 may represent the same output phase as represented by the iso-phase 403. Notably, the m-th phase characteristic 442 and the m-th gain characteristic 452 are with respect to a different supply voltage ($V_{CCM}$). The PA bias voltages and DA bias voltages associated with the iso-phase 443 (which are depicted in an m-th bias voltage profile 444) may be determined. The m-th bias voltage profile 444 may be projected onto the m-th gain characteristic 452. An output gain 454 associated with the m-th bias voltage profile 444 may be determined from the projection. The m-th bias profile may describe a signal profile of the first bias signal and the second bias signal with respect to a supply voltage determined by an m-th RF envelope. As described above, any number of feasible iso-phases may be selected with respect to phase plot 421 and phase plot 441. Correspondingly, any feasible number of bias voltage profiles associated with different selected iso-phases also may be determined.

Although solutions for determining iso-phases, bias voltage profiles, and output gains are described above as graphical operations, any other feasible operations may be used. For example, numerical operations may be performed to determine iso-phases, output gains, and/or control signal profiles (e.g., bias voltage profiles, bias current profiles).

Figure 6:
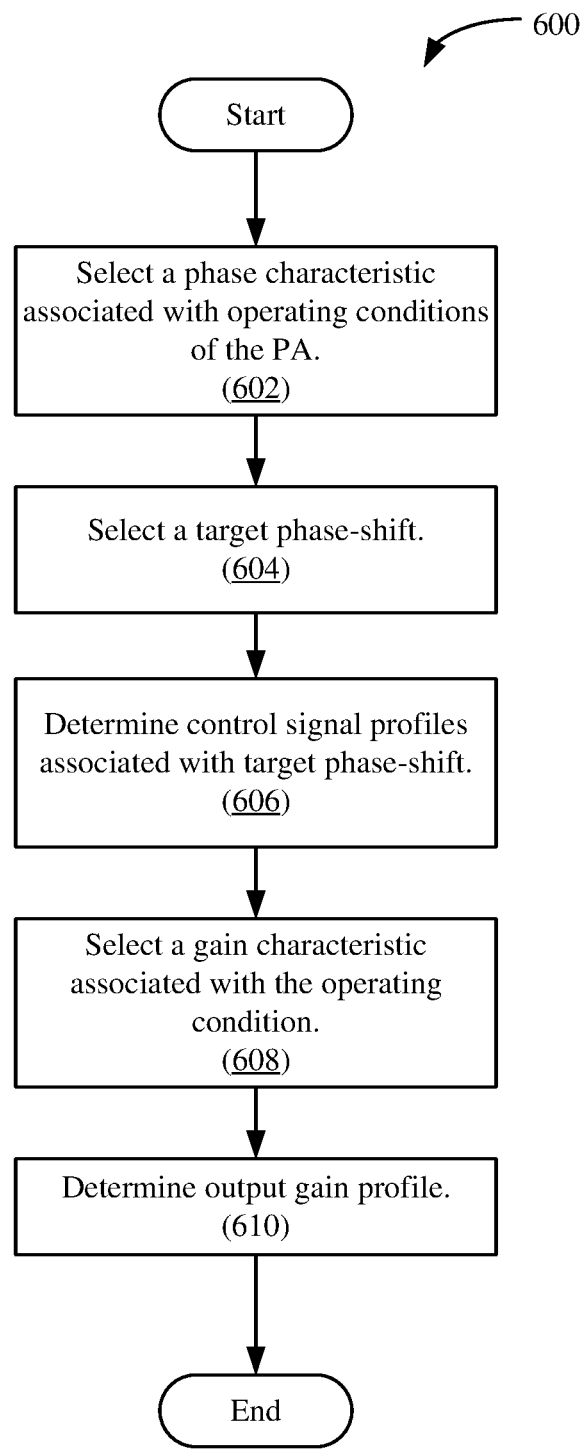
FIG. 6 is an illustrative flow chart depicting an example operation for determining profiles of the bias voltages for a linearizable power amplifier.

FIG. 6 is an illustrative flow chart depicting an example operation 600 for determining profiles of the bias voltages for a linearizable PA. The example operation 600 is described herein with reference to the linearizable PA 340 and the amplifier controller 350 of FIG. 3. Although the example operation 600 determines profiles of bias voltages, in other implementations, similar operations may determine profiles of bias currents and/or a mixture of bias voltages and bias currents. As described herein, the operation 600 is performed by the amplifier controller 350. In other example implementations, the operation 600 may be performed by the controller 230 of FIG. 2, the external controller 370 of FIG. 3, a combination of two or more of these controllers or any other suitable controller or processor (not shown for simplicity).

The operation begins as the amplifier controller 350 selects an output phase characteristic of the linearizable PA 340 associated with one or more operating conditions (602). In some implementations, the operating conditions may include power supply voltage ($V_{CC}$), operating frequency, operating bandwidth, and/or network information associated with the linearizable PA 340. In some implementations, the power supply voltage may be determined, at least in part, by an RF envelope of an RF input signal. Thus, the selected output phase characteristic may be with respect to an RF envelope. Example network information may include external filter information (e.g., information regarding filters that may be coupled directly or indirectly to the linearizable PA 340), network matching information, or any other feasible operating information associated with the linearizable PA 340. In one implementation, the output phase characteristic may be selected (e.g., retrieved) from the memory 240 and/or the characterization data 242 of FIG. 2.

Next, the amplifier controller 350 may select a target phase-shift from the selected output phase characteristic (604). The target phase-shift may be a phase-shift with a constant output phase. Thus, the target phase-shift also may be referred to as a desired phase-shift or an iso-phase of the linearizable PA 340. For example, with respect to the output phase and output gain characteristics depicted in graph 400 of FIG. 4, the amplifier controller 350 may select iso-phase 403 in the output phase characteristic 402 as a target phase shift.

Next, the amplifier controller 350 determines control signal profiles (also referred to as bias trajectories) associated with the target phase-shift (606). In some implementations, the control signal profiles may be profiles for independent bias control signals such as the first bias signal 345 and the second bias signal 346. In some other implementations, the control signal profiles may be the associated PA bias and DA bias profiles that, in turn, are associated with the target phase-shift. For example, for the selected iso-phase 403, the amplifier controller 350 may determine the first bias voltage profile 404 describing profiles of the DA bias and the PA bias voltages. In some embodiments, the amplifier controller 350 may determine several different control signal profiles for different supply voltages ($V_{CC}$) (e.g., different RF envelopes), but for the same selected target phase-shift.

Next, the amplifier controller 350 may select an output gain characteristic associated with one or more operating conditions (608). As described above, operating conditions may include power supply voltage ($V_{CC}$), operating frequency, operating bandwidth, and/or network information associated with the linearizable PA 340. Thus, the selected output gain characteristic may be with respect to an RF envelope. In one implementation, the output gain characteristic may be selected (e.g., retrieved) from the memory 240 and/or the characterization data 242. Next, the amplifier controller 350 may determine an output gain profile (610).

For example, the amplifier controller 350 may determine an associated output gain 414 for the first bias voltage profile 404. In some embodiments, the amplifier controller 350 may determine several different output gains for different output voltages ($V_{CC}$).

The phase and gain characterizations described above with respect to FIGS. 4 and 6 enable the amplifier controller 350 to generate a composite control signal profile (e.g., a composite bias signal profile) that may significantly linearize output phase and/or output gain associated with the linearizable PA 340. The composite control signal profile may describe signal profiles of the first bias signal 345 and the second bias signal for a variety of power supply voltages. An example graphical solution to determine the composite control signal profile is described below in FIG. 7. Although described herein as a graphical solution, other solutions are possible. For example, the graphical solution described with respect to FIG. 7, may be determined numerically.

Figure 7:
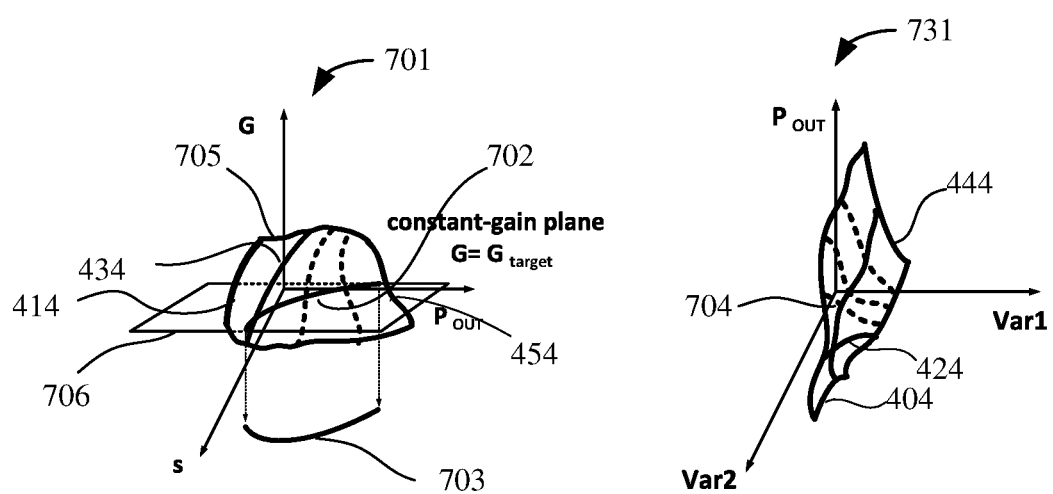
FIG. 7 depicts an example composite gain profile and an example composite phase profile.

FIG. 7 depicts an example composite gain profile 701 and an example composite phase profile 731. The composite gain profile 701 is based at least in part on the gain characteristics 412, 432, and 452 and the associated bias voltage profiles 404, 424, and 444 of FIG. 4. Note that as described above with respect to FIG. 4, the gain characteristics 412, 432, and 452 and the bias voltage profiles 404, 424, and 444 may be associated with different power supply voltages and, therefore, different RF envelopes. A constant gain curve 702 is shown on a composite gain surface 705. The composite phase profile 731 may be based at least in part on the phase characteristics 402, 422, and, 442 and iso-phases 403, 423, and 443 of FIG. 4. A constant phase curve 704 is shown on the composite phase profile 731. Note that as described above with respect to FIG. 4, the phase characteristics 402, 422, and 442 and the iso-phases 403, 423, and 443 may be associated with different power supply voltages and, therefore, different RF envelopes.

In some embodiments, the amplifier controller 350 may examine phase characteristics (such as phase characteristics 402, 422, and 442 of FIG. 4), and gain characteristics (such as gain characteristics 412, 432, and 452 of FIG. 4), and may determine a composite bias voltage profile 703 that provides a constant gain curve 702 and a constant phase curve 704 with respect to varying power supply voltages. Note that the constant gain curve 702 may be associated with an intersection of a plane 706 with the composite gain surface 705. In some other embodiments, the amplifier controller 350 may determine the composite bias voltage profile 703 based on the bias voltage profiles 404, 424, and 444 of FIG. 4. For example, the composite bias voltage profile 703 may be selected from a surface including the bias voltage profiles 404, 424, and 444 associated with different RF envelopes. In some aspects, the composite bias voltage profile 703 may be indexed with respect to an arbitrary variable. For example, the composite bias voltage profile 703 may be quantized and described with respect to an index value s, as shown in the composite gain profile 701. The amplifier controller 350 may determine the constant gain curve 702 from the output gains 414, 434, and 454 of FIG. 4. Note that since the output gains 414, 434, and 454 are based on the bias voltage profiles 404, 424, and 444, and since the bias voltage profiles 404, 424, and 444 are based on the same iso-phase, the constant phase curve 704 may not vary with respect to supply voltage ($V_{CC}$) or bias index. As described above, the supply voltage ($V_{CC}$) may be the supply voltage of a linearizable PA (such as the linearizable PA 340 of FIG. 3).

Although solutions for determining the composite bias voltage profile 703 is described above as a graphical operation, any other feasible operations may be used. For example, numerical operations may be performed to determine the composite bias voltage profile 703.

Figure 8:
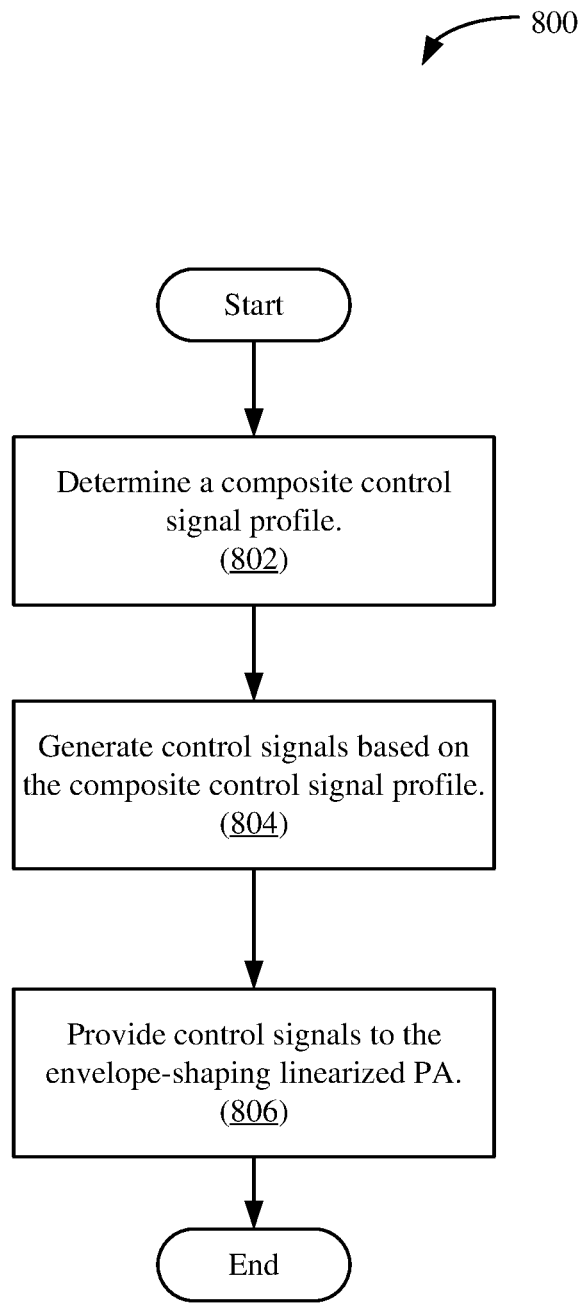
FIG. 8 is an illustrative flow chart depicting an example operation for operating a linearizable power amplifier Like reference numbers and designations in the various drawings indicate like elements.

FIG. 8 is an illustrative flow chart depicting an example operation 800 for operating a linearizable PA. As described herein, the operation 800 is performed by the amplifier controller 350. In other implementations, the operation 800 may be performed by the controller 230 of FIG. 2, the external controller 370 of FIG. 3, a combination of two or more of these controllers or any other suitable controller or processor (not shown for simplicity).

The operation 800 begins as the amplifier controller 350 determines a composite control signal profile (802). In some implementations, the composite control signal profile may be based on a plurality of control signal profiles associated with, for example, common operating conditions. The composite control signal profile may describe the signal profiles of independent control signals such as the first bias signal 345 and the second bias signal 346. In one implementation, the independent control signal may be a DA bias voltage and a PA bias voltage for the linearizable PA 340. The composite control signal profile may describe the gain of the linearizable PA 340 with respect to an arbitrary index s. The index s may be associated with a first control signal and a second control signal. In some implementations, the first control signal and the second control signal may be bias voltage signals, bias current signals, or a combination of bias voltage signals and bias current signals. In some other implementations, the composite control signal profiles may be associated with a selected phase-shift and/or a selected gain. For example, as described above with respect to FIG. 7, the amplifier controller 350 may determine the composite bias voltage profile 708 from a surface 707 including the bias voltage profiles 404, 424, and 444 of FIG. 4. The composite bias profile may be associated with a constant output phase and/or an output gain. In addition, the composite bias profile may be determined with respect to output power (shown as $P_{OUT}$) in FIG. 7. Output power may be related to a power supply voltage of the linearizable PA 340.

Next, the amplifier controller 350 may generate control signals based on the composite control signal profile (804). For example, the first control signal and the second control signal may be generated based on the composite control signal profile. As described above, the control signals may be generated by one or more envelope-shaped bias signal generators 390 of FIG. 3. For example, the amplifier controller 350 may provide PolarityCtrl signals 391 and SlopeCtrl signals 392 to one or more envelope-shaped bias signal generators 390 to generate the bias signals 394 (e.g., the first control signal and the second control signal). Next the amplifier controller 350 may provide the first control signal and the second control signal to the linearizable PA 340 (806). In some implementations, the first control signal may be provided to a first amplifying stage of the linearizable PA 340 and the second control signal may be provided to a second amplifying stage of the linearizable PA 340.

In some implementations, the procedure described by FIGS. 4-8 may be simplified by assuming a fixed power supply for the linearizable PA 340. For example, the control signals may be determined based on an output power level of the linearizable PA 340 instead of based on a power supply determined by an RF envelope. In one implementation, the gain and phase of the linearizable PA 340 may be characterized with respect to different output power levels and a fixed power supply. The characterization data may be collected based on simulation, bench testing, or any other feasible procedure. A plurality of iso-phase shift surfaces may be determined for each of the possible output power levels from the characterization data. Each iso-phase shift surface may be associated with independent control signals such as a first bias signal 345 and a second bias signal 346. A plurality of iso-gain surfaces may be determined with respect to each possible iso-phase surface from the characterization data. Each iso-gain surface also may be associated with the independent control signals. In some implementations, a cross-section based on each iso-phase shift surface intersecting with each iso-gain surface (at a particular output power level) may provide a control signal profile for the associated output power level. By combining many such control signal profiles, a constant-gain/phase surface may be generated to linearize operation of the linearizable PA 340 across a plurality of output power levels. Although a graphical solution is described above, numerical methods also may be used to find equivalent solutions.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices such as, for example, a combination of a DSP and a microprocessor, a plurality of microprocessors, one or more microprocessors in conjunction with a DSP core, or any other such configuration. In some implementations, particular processes and methods may be performed by circuitry that is specific to a given function.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An amplifier comprising:
   a first amplifying stage configured to receive a radio-frequency (RF) input signal;
   a second amplifying stage comprising an input coupled to an output of the first amplifying stage; and
   an amplifier controller configured to:
      provide a first bias signal for the first amplifying stage based on an RF envelope associated with the RF input signal and slope and polarity information; and
      provide a second bias signal for the second amplifying stage based on the RF envelope and the slope and polarity information, wherein the first bias signal is independent of the second bias signal.

2. The amplifier of claim 1, wherein the slope and polarity information is based on operating conditions of the amplifier.

3. The amplifier of claim 1, wherein the first bias signal and the second bias signal are determined at least in part by a signal profile based on the RF envelope.

4. The amplifier of claim 3, wherein the amplifier controller is further configured to generate the signal profile based on operating conditions of the amplifier.

5. The amplifier of claim 4, wherein the amplifier controller is further configured to:
   determine output phase characteristics of the amplifier based on the operating conditions;
   determine output gain characteristics of the amplifier based on the operating conditions and the output phase characteristics; and
   generate the signal profile of the first bias signal and the second bias signal based on the output phase characteristics, the output gain characteristics and the RF envelope.

6. The amplifier of claim 4, wherein the amplifier controller is further configured to:
   receive information through a Mobile Industry Processor Interface (MIPI) bus; and
   determine the operating conditions of the amplifier based on the information from the MIPI bus.

7. The amplifier of claim 6, wherein the operating conditions include at least one of transmit channel information, resource block information, transmit frequency information, transmit bandwidth information, or network information.

8. The amplifier of claim 1, further comprising a supply generator configured to:
   generate a supply voltage based on the RF envelope, wherein the first bias signal and the second bias signal are determined based on the supply voltage.

9. The amplifier of claim 1, wherein the amplifier controller is further configured to:
   detect the RF input signal; and
   determine the RF envelope based on the RF input signal; and
   determine the first bias signal and the second bias signal based on at least one of scaled, offset, or delayed information associated with the RF envelope.

10. The amplifier of claim 1, wherein the first bias signal is a first bias current, the second bias signal is a second bias current, and a profile of the first bias current and the second bias current is based on the RF envelope.

11. The amplifier of claim 1, wherein the amplifier controller is configured to receive information from an external controller implemented in a radio frequency front end of a wireless device including the amplifier, and wherein the amplifier controller is configured to determine the first bias signal and the second bias signal based at least in part on the received information.

12. The amplifier of claim 11, wherein the external controller is configured to adjust one or more elements of the radio frequency front end other than the amplifier.

13. A method to operate a power amplifier comprising:
   amplifying, by a first stage, a radio-frequency (RF) input signal;
   amplifying, by a second stage, an intermediate signal provided by the first stage;
   receiving slope and polarity information;
   generating a first bias signal and a second bias signal based on an RF envelope associated with the RF input signal and the slope and polarity information;
   providing the first bias signal to the first stage; and
   providing the second bias signal to the second stage, wherein the first bias signal is independent of the second bias signal.

14. The method of claim 13, wherein the slope and polarity information is based on operating conditions of the power amplifier.

15. The method of claim 13, wherein the first bias signal and the second bias signal are determined at least in part by a signal profile based on the RF envelope.

16. The method of claim 15, wherein the signal profile is further based on operating conditions of the power amplifier.

17. The method of claim 16, further comprising:
   determining output phase characteristics of the power amplifier based on the operating conditions;
   determining output gain characteristics of the power amplifier based on the operating conditions and the output phase characteristics; and
   generating the signal profile of the first bias signal and the second bias signal based on the output phase characteristics, the output gain characteristics, and the RF envelope.

18. The method of claim 17, wherein generating the signal profile further comprises:
   determining a target phase shift of the power amplifier based on the operating conditions; and
   generating the signal profile based on the target phase shift and the RF envelope.

19. The method of claim 16, further comprising:
receiving information through a Mobile Industry Processor Interface (MIPI) bus; and
determining the operating conditions from the information from the MIPI bus.

20. The method of claim 16, wherein the operating conditions include at least one of transmit channel information, resource block information, transmit frequency information, transmit bandwidth information, or network information.

21. The method of claim 20, wherein the network information includes impedance loading information associated with filters coupled to the power amplifier.

22. The method of claim 13, wherein determining the RF envelope comprises:
detecting the RF input signal; and
determining the RF envelope based on the RF input signal and at least one of scaling, offsetting, or delaying information associated with the RF envelope.

23. The method of claim 13, further comprising:
generating a supply voltage for the power amplifier based on the RF envelope, wherein the first bias signal and the second bias signal are determined based on the supply voltage.

24. The method of claim 13, wherein the first bias signal is a first bias current, the second bias signal is a second bias current, and a profile of the first bias current and the second bias current is based on the RF envelope.

25. A power amplifier comprising:
means for amplifying a radio-frequency (RF) input signal based on a first bias signal;
means for amplifying an intermediate signal provided by the means for amplifying the RF input signal based on a second bias signal;
means for receiving slope and polarity information; and
means for generating the first bias signal and the second bias signal based on an RF envelope associated with the RF input signal and the slope and polarity information, wherein the first bias signal is independent of the second bias signal.

26. The power amplifier of claim 25, wherein the means for generating the first bias signal and the second bias signal is further based on operating conditions of the power amplifier.

27. The power amplifier of claim 26, further comprising:
means for receiving information through a Mobile Industry Processor Interface (MIPI) bus, wherein the operating conditions are based on the information from the MIPI bus.

* * * * *